United States Patent [19]
Takamura et al.

[11] Patent Number: 5,592,223
[45] Date of Patent: Jan. 7, 1997

[54] CHARGE-COUPLED DEVICE HAVING ON-CHIP LENS

[75] Inventors: Yoji Takamura; Hiroki Endo, both of Kanagawa, Japan

[73] Assignee: Sony Corporation, Tokyo, Japan

[21] Appl. No.: 440,213

[22] Filed: May 12, 1995

Related U.S. Application Data

[63] Continuation of Ser. No. 149,945, Nov. 10, 1993, abandoned.

[30] Foreign Application Priority Data

Nov. 11, 1992 [JP] Japan .................................. 4-301204

[51] Int. Cl.⁶ .......................... H04N 3/14; H04N 5/335; H04N 5/225; H04N 9/083
[52] U.S. Cl. .......................... 348/309; 348/291; 348/340; 348/266; 348/290
[58] Field of Search ................................. 348/309, 327, 348/342, 290, 266–283, 291, 340; 250/208.1; 257/431–436, 440; 359/619, 642, 741, 742; H04N 3/14, 5/335, 5/225, 9/083

[56] References Cited

U.S. PATENT DOCUMENTS

| | | | |
|---|---|---|---|
| 4,561,015 | 12/1985 | Korch | 348/340 |
| 4,721,999 | 1/1988 | Takemura et al. | 348/276 |
| 5,074,649 | 12/1991 | Hamanaka | 359/619 |
| 5,239,172 | 8/1993 | Yokota et al. | 257/431 |
| 5,306,926 | 4/1994 | Yonemoto | 257/432 |
| 5,321,297 | 1/1994 | Enomoto | 257/443 |
| 5,323,052 | 1/1994 | Koyoma | 257/432 |

*Primary Examiner*—Michael T. Razavi
*Assistant Examiner*—Bipin Shalwala
*Attorney, Agent, or Firm*—Hill, Steadman & Simpson

[57] ABSTRACT

In a color CCD (charge-coupled device) imaging device where chromatic filter components are formed on sensor units functioning as pixels, respectively, and small condenser lenses are provided on the respective chromatic filter components, it is so constructed that areas of the small condenser lenses are varied, depending upon film thickness of the respective chromatic filter components. Then, the sensitivity increasing rates for the respective pixels of the color CCD imaging device are uniformed.

19 Claims, 6 Drawing Sheets

CHARGE-COUPLED DEVICE HAVING ON-CHIP LENS

This is a continuation, of application Ser. No. 08/149,945, filed Nov. 10, 1993, now abandoned.

BACKGROUND OF THE INVENTION

1. Field of the Invention

The present invention generally relates to a solid-state imaging device, e.g., a CCD (charge-coupled device) image sensor or the like. More specifically, the present invention is directed to a charge-coupled device having a plurality of color filters, and a plurality of on-chip condenser lenses whose dimensions and curvature values are different from each other based upon thicknesses of the color filters.

2. Description of the Prior Art

A CCD solid-state imaging device, specifically a color solid-state imaging device is constructed as follows. That is, as illustrated in FIG. 1, sensor portions 2 functioning as the respective pixels, namely photodiodes functioning as light sensitive portions are formed on the surface of a semiconductor substrate 1, a color filter 4 constructed of chromatic filter components is fabricated via a protection film 3 on the overall surface of the semiconductor substrate 1 containing the sensor portions 2, and microscopic (small) condenser lenses 5 for increasing sensitivities of the CCD solid-state imaging elements or sensor portions 2 are formed on the respective chromatic filter components, respectively. Insulating films 7 are formed on the surface of semiconductor substrate 1 between adjacent sensor portions 2.

The color filter 4 is manufactured, as shown in, for example, FIG. 2, in such a manner that a pattern formed of green (G), cyan (Cy), yellow (Ye), and magenta (Mg) chromatic filter components 4G, 4Cy, 4Ye and 4Mg is repeated. Each small condenser lens 5 is made of, for instance, a photoresist film.

As previously explained, the above-described method for forming the small condenser lenses 5 on the sensor portions 2 has been conventionally employed so as to increase the sensitivities of the CCD solid-state imaging element. In this case, there is a problem in a product whose CCD solid-state imaging element employs the color filter 4. Namely, sensitivity increasing rates for the respective pixels are different from each other, depending upon the patterns of the chromatic filter components formed on the sensor portions 2.

A change in a sensitivity increasing rate is also caused by the thickness of the protection film 3 mounted on the photodiodes 2 functioning as the light sensitive portions and also the thicknesses of the respective chromatic filter components 4G, 4Cy, 4Ye and 4Mg. When, for instance, a green dye layer (i.e., the green filter component 4G) is formed by a dye of an additive complementary color, this green dye layer is formed by overlapping a cyan dye layer (namely, the cyan filter component 4Cy) with a yellow dye layer (namely, the yellow filter component 4Ye). As a consequence, a thickness t of the green dye layer 4G is different from thicknesses $t_2$ and $t_3$ of the cyan dye layer 4Cy and yellow dye layer 4Ye. Also, as to the cyan dye layer and the yellow dye layer, the thicknesses $t_2$ and $t_3$ thereof are separately selected to be proper values, taking account of color reproducibilities and appearances of false signals. Accordingly, the thicknesses $t_1$, $t_2$, $t_3$ and $t_4$ of the respective dye layers, i.e., respective chromatic filter components 4G, 4Cy, 4Ye, and 4Mg fabricated on the respective sensor portions of the imaging device, represent different values, depending upon the pattern of the color filter 4.

In case that the thicknesses of the color filter components (dye layers) differ from each other, the light converging rate achieved when the small condenser lenses 5 are provided is varied due to refractive index and the like. As a result, the increasing rate of sensitivity achieved when the small condenser lenses 5 are provided to that when no small condenser lenses 5 are employed represents different values with respect to the pixels, depending upon the pattern of the color filter 4.

In other words, as indicated in FIG. 3, the sensitivity increasing rate of the cyan dye layer 4Cy represents the highest value, and then the sensitivity increasing rates of the magenta, yellow, and green dye layers 4Mg, 4Ye, and 4G are successively lowered. It is assumed in this figure that magnification achieved when no lens if employed is 1.0.

If the sensitivity increasing rates would be different from each other, then the false signal when the small condenser lenses are provided will appear in a different manner, as compared with the appearance of the false signal when no small condenser lenses are employed, for instance, in order to perform the signal processing operation, thereby separating the luminance signal from the color signal in case of the CCD solid-state imaging device with employment of the color filters 4 belonging to the additive complementary color system. Furthermore, color reproducibility would be changed due to a similar reason to the above-explained reason.

To make a CCD solid-state imaging device compact in size without deteriorating its resolution, since an area of a light sensitive portion thereof is necessarily reduced, the sensitivity of the imaging device is tried to be increased by increasing the converging rate of the small condenser lenses 5 formed on the sensor portions 2. As a consequence, such differences in the sensitivity increasing rates for the respective pixels caused by the small condenser lenses may greatly give adverse influences to chromatic characteristic of the color CCD solid-state imaging device when the color CCD solid-state imaging apparatus is made compact in size. Also, these sensitivity increasing rates may constitute important factors to determine these values.

SUMMARY OF THE INVENTION

The present invention has been made to solve the above-described problems of the conventional solid-state imaging devices, and has an object to provide a solid-state imaging device capable of, in particular, improving (namely, uniforming or equalizing) sensitivity increasing rates of pixels.

In accordance with a first aspect of the present invention, in such a solid-state imaging device that predetermined color filter components 15G, 15Ye, 15Cy, and 15Mg are formed on sensor portions 13 constituting pixels, and small (microscopic) condenser lenses 16 are provided on the respective color filter components 15G, 15Ye, 15Cy, and 15Mg, areas of the small condenser lenses 16 are varied, depending upon film thicknesses of the color filter components.

According to a second aspect of the present invention, in the solid-state imaging device of the first aspect of the present invention, it is so arranged that curvature values of the small condenser lenses 16 corresponding to the respective color filter components 15G, 15Ye, 15Cy, and 15Mg are made identical to one another.

In accordance with a third aspect of the present invention, in such a solid-state imaging device that predetermined color filter components 15G, 15Ye, 15Cy, and 15Mg are formed on sensor portions 13 constituting pixels, respectively, and small (microscopic) condenser lenses 16 are provided on the respective color filter components 15G, 15Ye, 15Cy, and 15Mg, areas of the small condenser lenses 16 are made identical to one another, and also curvature values of the small condenser lenses 16 are changed, depending upon film thicknesses of the color filter components 15G, 15Ye, 15Cy, and 15Mg, respectively.

In accordance with a fourth aspect of the present invention, in such a solid-state imaging device that predetermined color filter components 15G, 15Ye, 15Cy, and 15Mg are formed on sensor portions 13 constituting pixels, respectively, and small (microscopic) condenser lenses 16 are provided on the respective color filter components 15G, 15Ye, 15Cy, and 15Mg, areas of the small condenser lenses 16 are changed, depending on refractive indexes of the color filter components 15G, 15Ye, 15Cy, and 15Mg.

According to a fifth aspect of the invention, in the solid-state imaging device of the fourth aspect of the present invention, it is so arranged that curvature values of the small condenser lenses 16 corresponding to the respective color filter components 15G, 15Ye, 15Cy, and 15Mg are made identical to one another.

In accordance with a sixth aspect of the present invention, in such a solid-state imaging device that predetermined color filter components 15G, 15Ye, 15Cy, and 15Mg are formed on sensor portions 13 constituting pixels, respectively, and small (microscopic) condenser lenses 16 are provided on the respective color filter components 15G, 15Ye, 15Cy, and 15Mg, areas of the small condenser lenses 16 are made identical to one another, and curvature values of the small condenser lenses 16 are varied in accordance with the film thicknesses of the respective filter components 15G, 15Ye, 15Cy, and 15Mg.

In the solid-state imaging device of the first aspect of the invention, the areas of the small condenser lenses 16 are changed, depending on the film thicknesses of the color filter components 15G, 15Ye, 15Cy, and 15Mg for the respective pixels, so that the sensitive increasing rates of the respective pixels can be improved, namely uniformed, and appearances of false signals and also color reproducibility can be properly adjusted.

In the second aspect of the invention, the sensitivity increasing rates for the respective pixels can be improved by making the curvature values of the respective small condenser lenses 16 identical to one another, and also changing the areas of the small condenser lenses 16 in accordance with the film thicknesses of the respective color filter components 15G, 15Ye, 15Cy, and 15Mg.

In the third aspect of the invention, the sensitivity increasing rates for the respective pixels can be similarly improved by making the areas of the respective small condenser lenses 16 identical with one another and further by varying the curvature values of the small condenser lenses 16, depending upon the film thicknesses of the respective color filter components 15G, 15Ye, 15Cy, and 15Mg.

In accordance with the fourth aspect of the invention, the areas of the small condenser lenses 16 are changed in accordance with the refractive indexes of the color filter components 15G, 15Ye, 15Cy, and 15Mg for the respective pixels, so that the sensitivity increasing rates for the respective pixels can be similarly improved, namely uniformed, and also appearances of false signals and color reproducibility can be properly adjusted.

According to the fifth aspect of the invention, the curvature values of the respective small condenser lenses 16 are identical to each other and the areas of the small condenser lenses 16 are changed in accordance with the refractive indexes of the respective color filter components 15G, 15Ye, 15Cy, and 15Mg in the solid-state imaging device of the fourth aspect of the invention. As a consequence, the sensitivity increasing rates for the respective pixels can be similarly improved.

In accordance with the sixth aspect of the invention, since the areas of the respective small condenser lenses 16 are made identical to each other and also the curvature values of the respective small condenser lenses 16 are changed dependent upon the refractive indexes of the color filter components 15G, 15Ye, 15Cy, and 15Mg, the sensitivity increasing rates for the respective pixels can be similarly improved.

BRIEF DESCRIPTION OF THE DRAWINGS

For a better understanding of these and other objects of the present invention, reference is made of the following detailed description of the invention to be read in conjunction with the following drawings, in which.

DETAILED DESCRIPTION OF THE PREFERRED EMBODIMENTS

Figure 1:
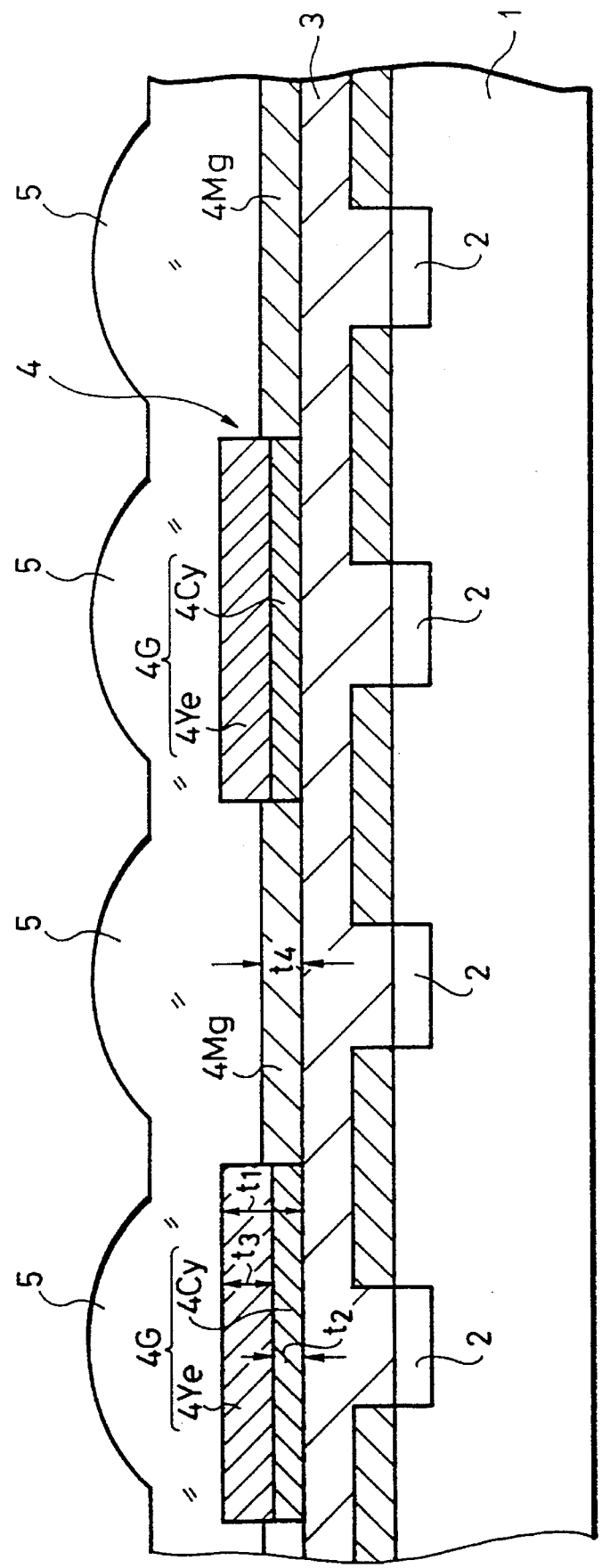
FIG. 1 is a sectional view of the conventional solid-state imaging device.

Referring now to the drawings, embodiments of the present invention will be described below.

Figure 4:
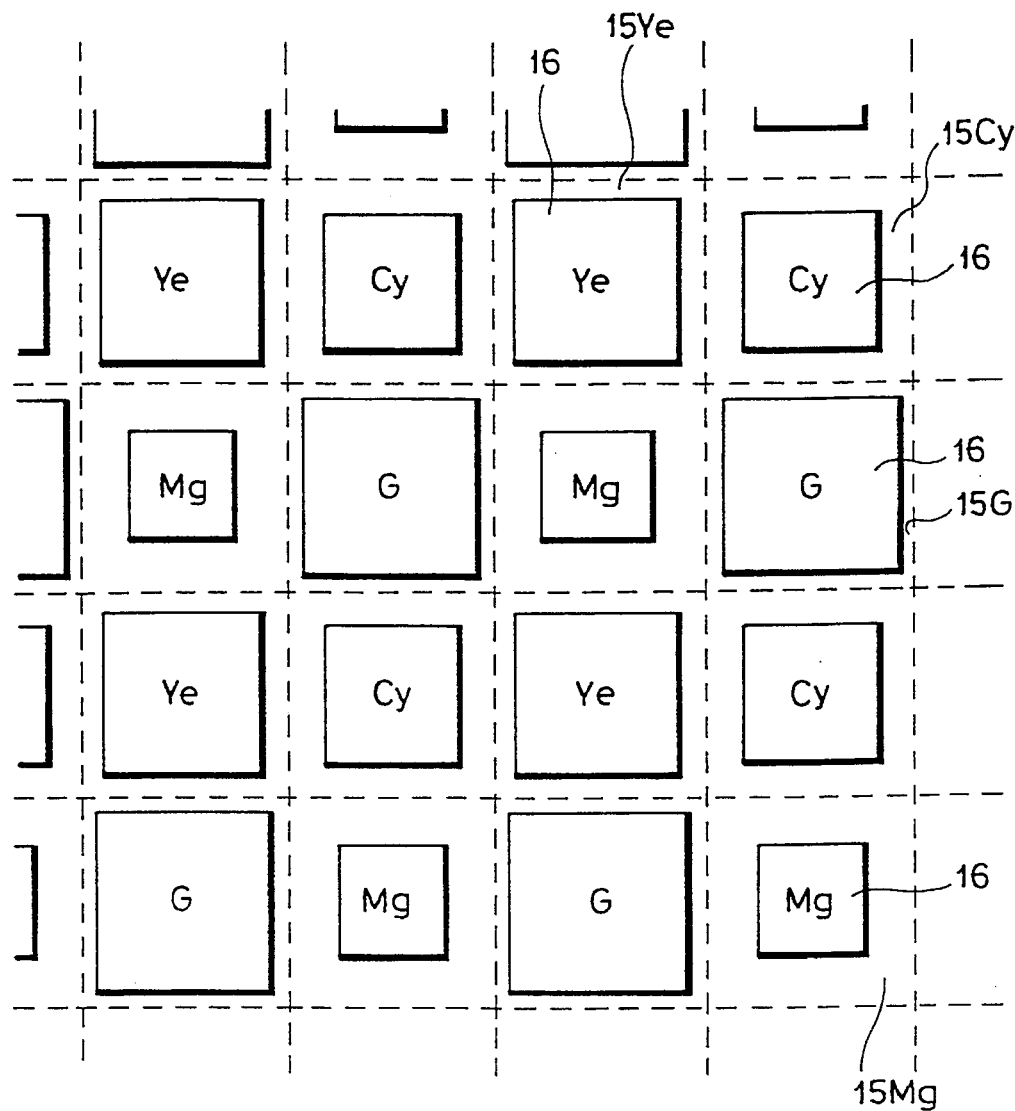
FIG. 4 is a plan view for showing an embodiment of a solid-state imaging device according to the present invention.
Figure 5:
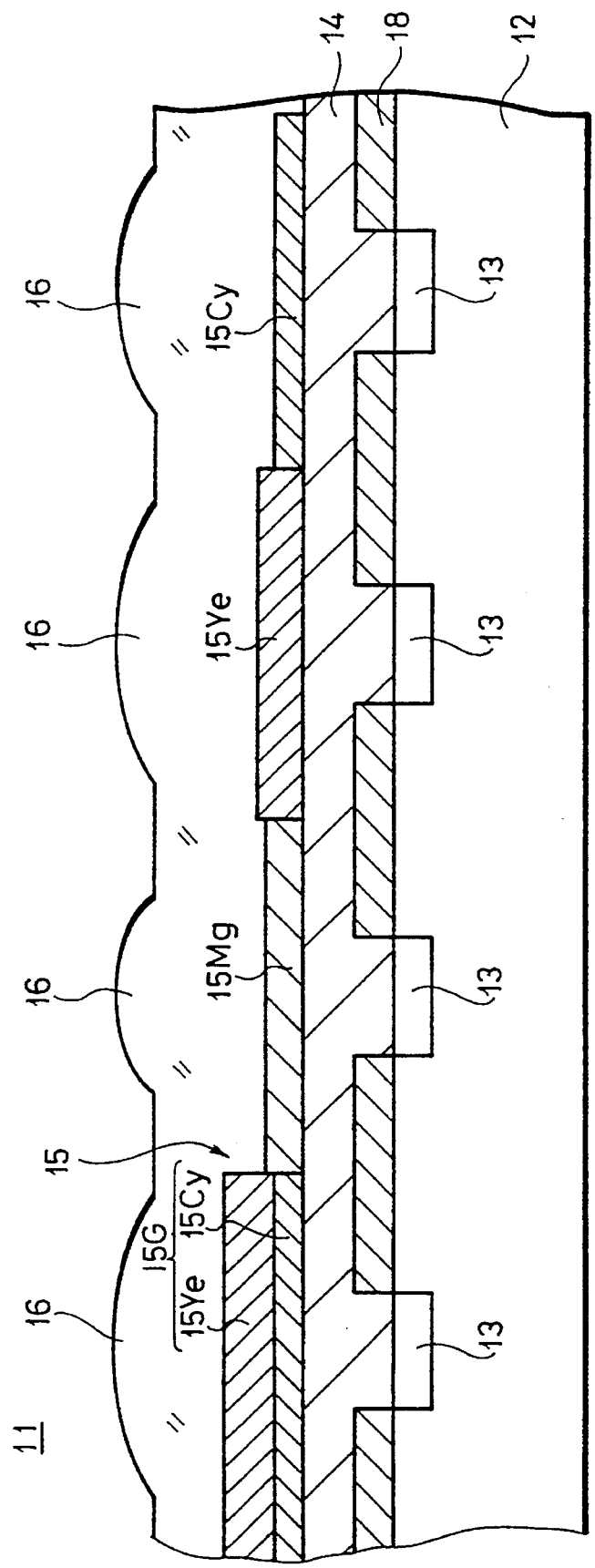
FIG. 5 is a sectional view of the solid-state imaging device represented in FIG. 4.

FIG. 4 and FIG. 5 depict an embodiment of a CCD (charge-coupled device) solid-state imaging device according to the present invention. In the drawings, reference numeral 11 generally shows a CCD solid-state imaging device, particularly an imaging region unit, in which a plurality of sensor units (i.e., photodiodes functioning as light receiving portions) 13 which will constitute pixels of the CCD solid-state imaging device 11, are formed on a semiconductor substrate 12 in a matrix form. Further, a color filter 15 constructed of respective chromatic filter components is formed via a protection film 14 on the imaging region unit having the sensor units 13, and a group of small (microscopic) condenser lenses 16 are formed on the color filter 15 so as to increase sensitivity of the CCD solid-state imaging device. Reference numeral 18 denotes an insulating film formed on the semiconductor substrate 12 between adjacent sensor units 13.

Figure 2:
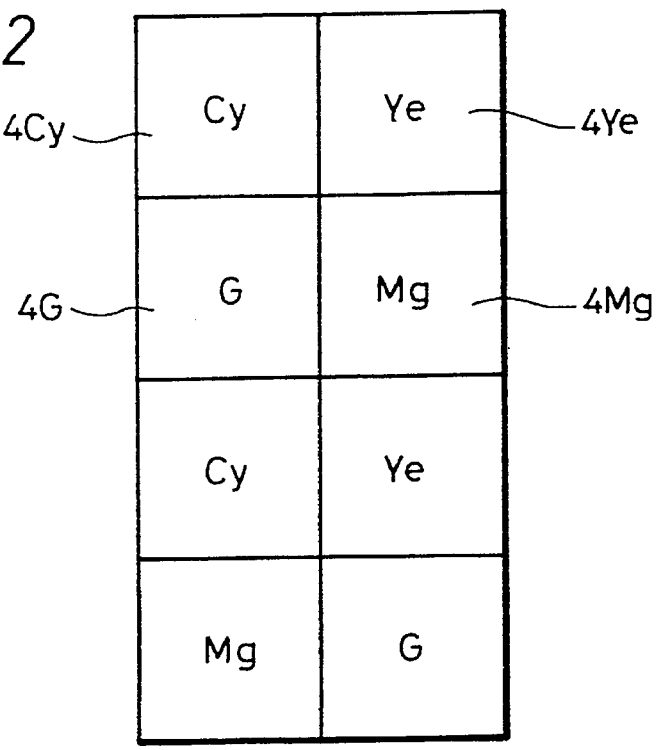
FIG. 2 is a plan view for showing an example of a color filter pattern by additive complementary colors of dyes.
Figure 3:
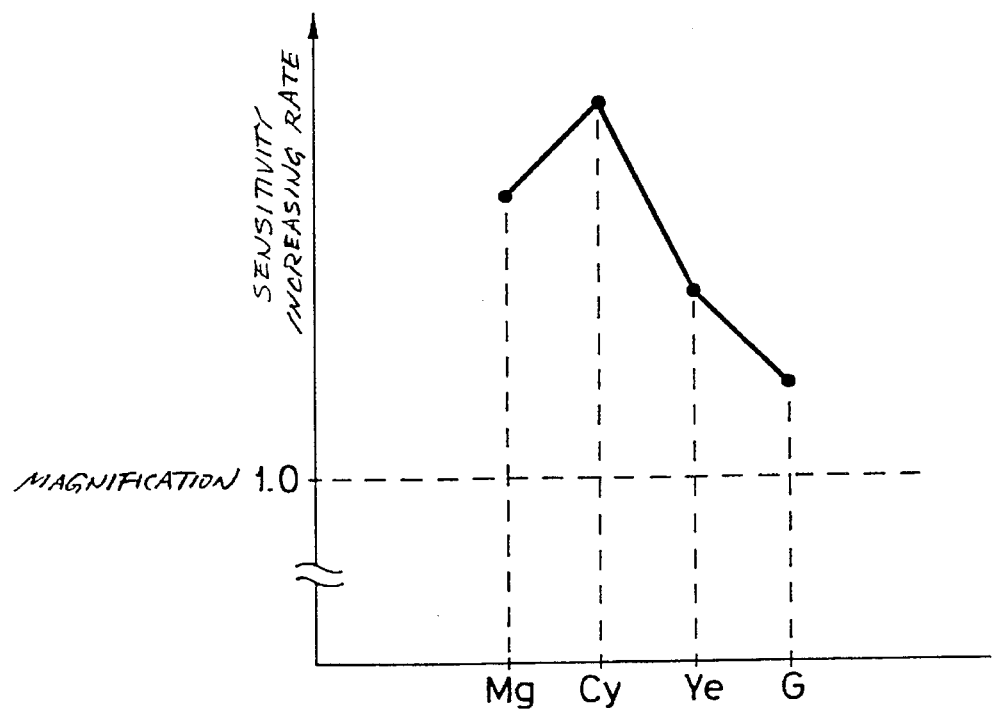
FIG. 3 is a graphic representation of the sensitivity increasing rates for the respective colors in the CCD solid-state imaging device.

It should be understood that a pattern of the color filter 15 is formed similar to that of FIG. 2 in such a manner that the pattern formed of the respective chromatic filter components 4G, 4Cy, 4Ye, and 4Mg of green (G), cyan (Cy), yellow (Ye)

and magenta (Mg) is repeatedly arranged as illustrated in FIG. 2. The film thicknesses $t_1, t_2, t_3$, and $t_4$ of the respective chromatic filter components 4G, 4Cy, 4Ye, 4Mg are selected to satisfy a relationship of $t_1 > t_3 > t_4 > t_2$ in the order of green (G), yellow (Ye), magenta (Mg), and cyan (Cy).

Figure 7:
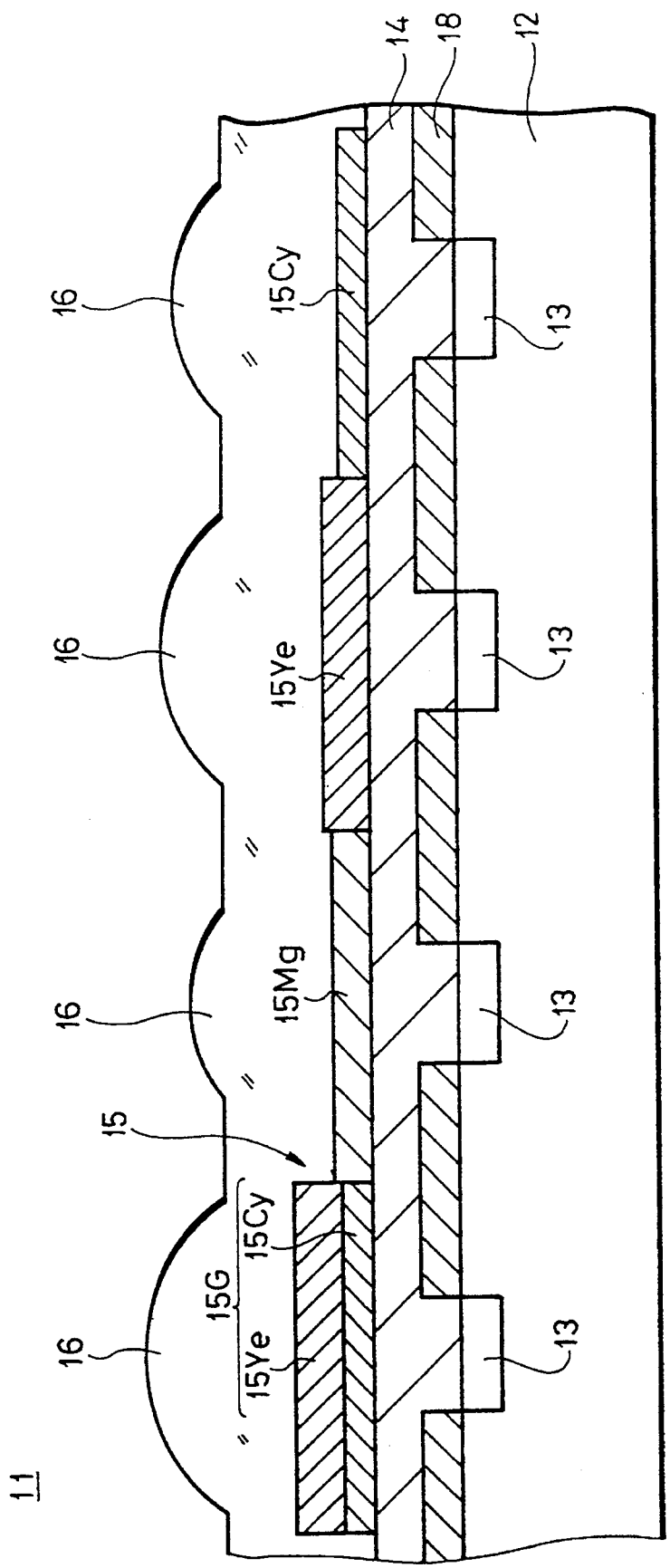
FIG. 7 is a sectional view for representing a further embodiment of the solid-state imaging device according to the present invention.

As a consequence, in accordance with this embodiment shown in FIGS. 4 and 5, the small condenser lenses 16 whose areas are different from one another are fabricated on the respective chromatic filter components 15G, 15Ye, 15Mg and 15Cy for green (G), yellow (Ye), magenta (Mg), and cyan (Cy), the sensitivity increasing rates of which are different from one another due to difference in the film thicknesses as shown in FIG. 7. In other words, according to this embodiments, as illustrated in FIG. 5, the areas of the small condenser lenses 16 are sequentially changed in such a way that the areas of the small condenser lenses 16 are gradually decreased in the order of the green filter component 15G, the yellow filter component 15Ye, the cyan filter component 15Cy, and the magenta filter component 15Mg.

In this case, since the small condenser lenses 16 having the different areas may be manufactured by patterning the photoresist layer and finally by performing the reflow process to the patterned photoresist layer, and at the same time, the film thickness of the photoresist layer is identical, values of lens curvature among the small condenser lenses 16 having the different areas are different from one another.

With the above-described structure the areas of the small condenser lenses 16 formed on the respective chromatic filter components 15G, 15Ye, 15Cy, and 15Mg are made different from one another, depending upon the film thicknesses of these chromatic filter components 15G, 15Ye, 15Cy, and 15Mg, so that the sensitivity increasing rates for the respective colors can be uniformed, or equalized.

That is the converging rates at the sensor units 13 corresponding to green (G), and yellow (Ye) are increased, so that the sensitivity increasing rates are increased, and also the converging rates at the sensor units 13 corresponding to cyan (Cy) and magenta (Mg) are decreased, so that the sensitivity increasing rates are lowered. As a consequence, the sensitivity increasing rates for the pixels of the respective colors of the CCD imaging device can be unformed. Thus, appearance of false signals and color reproducibility may be properly adjusted, or controlled, so that such a CCD solid-state imaging device with high reliability can be obtained. In particular, when the CCD solid-state imaging device would be made compact in size, the sensitivity increasing rates for the respective color pixels thereof could be uniformed without deteriorating its resolution and furthermore with increasing of the converging rate.

Figure 6:
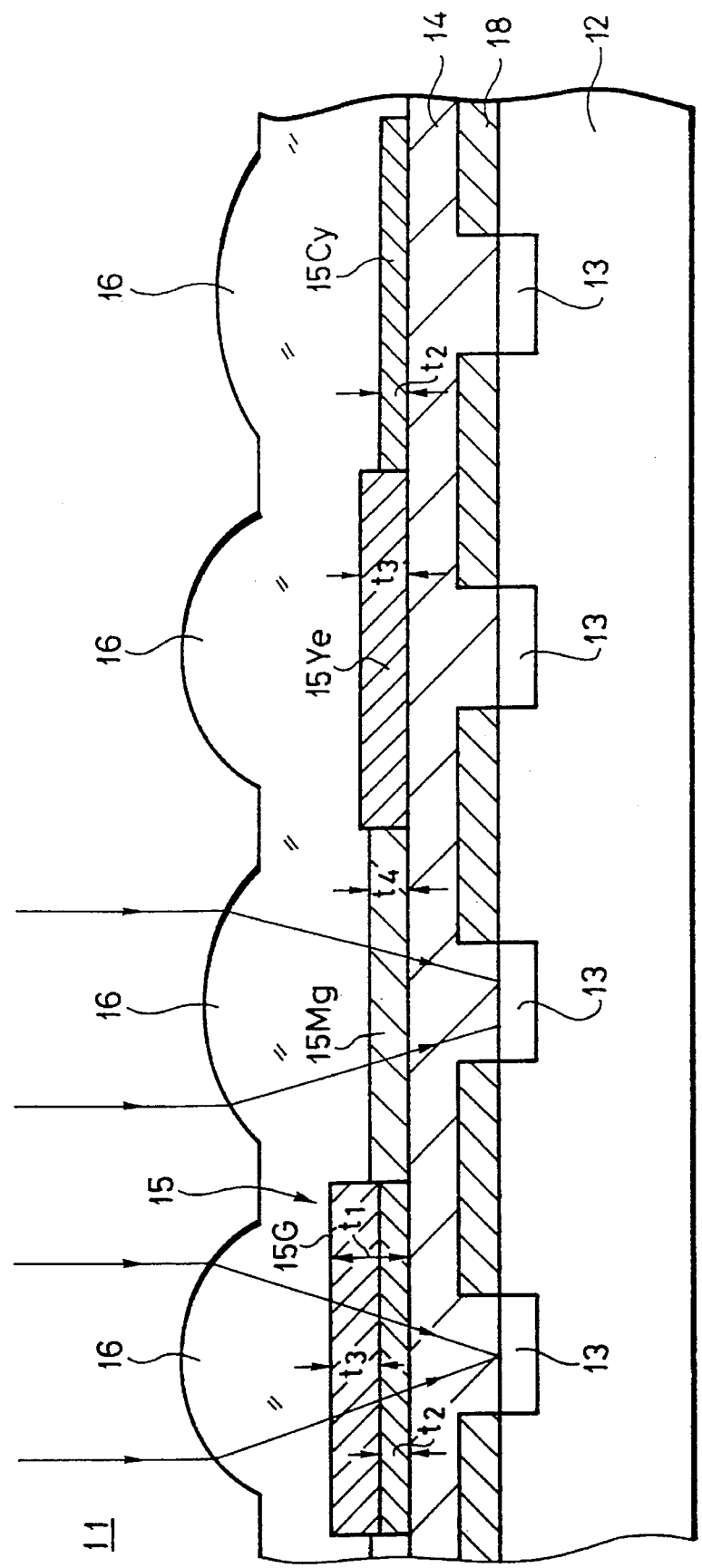
FIG. 6 is a sectional view for showing another embodiment of the solid-state imaging device according to the present invention.

FIG. 6 represents another embodiment of the CCD solid-state imaging sensor according to the present invention. It should be noted that the same reference numerals shown in FIG. 4 and FIG. 5 will be employed as those for denoting the same elements shown in FIG. 6, and explanations thereof are omitted.

In this embodiment shown in FIG. 6, small condenser lenses 16 for the respective chromatic filter components 15G, 15Ye, 15Cy, and 15Mg are formed in such a manner that values of lens curvature (namely, curvature diameters) of these small condenser lenses 16 are made different from one another with respect to the respective color pixels of this CCD solid-state imaging device, while the areas of these small condenser lenses 16 are kept constant with one another. It should be noted that a group of small condenser lenses whose areas are made constant and whose curvature diameters are made different may be fabricated by, for instance, making the film thickness of the photoresist film different from one another with regard to these chromatic filter components. In other words, lights passing through the small condenser lenses 16 are focused so as to increase converging capabilities at the sensor units with the lower sensitivity increasing rates, whereas lights passing through the small condenser lenses is focused in order to decrease converging capabilities at the sensor units with the higher sensitivity increasing rates.

Also with this structure, the sensitivity increasing rates of the respective pixels can be uniformly improved, and also appearances of false signals and color reproducibility can be properly controlled.

FIG. 7 shows a further embodiment of the CCD solid-state image device according to the present invention. It should be noted that the same reference numerals shown in FIG. 4 and FIG. 5 will be employed as those for indicating the same elements shown in FIG. 7 and explanations thereof are omitted.

In this embodiment, it is so arranged that curvature diameters of the small condenser lenses 16 are made identical to one another but areas of these small condenser lenses 16 are made different from one another in accordance with the film thicknesses of the respective chromatic filter components 15G, 15Ye, 15Cy, and 15Mg.

Also in this case the sensitivity increasing rates of the respective pixels can be uniformly improved by the differences of the light converging capabilities of the small condenser lenses 16 depending upon their areas.

It should be understood that as stated above, to improve differences in the sensitivity increasing rates caused by differences in the refractive indexes due to the thickness differences of the chromatic filter components, the shapes of the small condenser lenses have been changed for the respective pixels in the preceding embodiments. Alternately, a structure of small condenser lenses similar to those condenser lenses 16 of FIG. 4 and 5, FIG. 6, or FIG. 7 may be employed even in such a case to improve difference in sensitive increasing rates of the respective pixels caused by differences in the refractive indexes due to dye materials of the respective chromatic filter components, while the film thicknesses of these chromatic filter components are made equal to one another, although not shown in the drawings. Then, similar advantages to those of the previous embodiments can be achieved.

In accordance with the solid-state imaging devices of the present invention, the areas and/or curvature diameters of the small condenser lenses with respect to each of these chromatic filter components for the respective pixels are varied, so that the sensitivity increasing rates for the respective color pixels can be uniformed. As a consequence, appearances of the false signals and the color reproducibility can be properly controlled, whereby such solid-state imaging devices with high reliability can be manufactured.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid-state imaging device, comprising:
   a plurality of light sensitive portions formed on a semiconductor substrate;
   a plurality of color filter layers formed above said respective light sensitive portions; and a plurality of lenses formed above said respective color filter layers, wherein diameters of said lenses in light receiving area are made different from one another in accordance with thicknesses of said color filter layers.

2. A solid-state imaging device according to claim 1, wherein said lenses have substantially the same values of curvature.

3. A solid-state imaging device according to claim 1, wherein said color filter layers are made of cyan, yellow and magenta dyes, respectively.

4. A solid-state imaging device according to claim 1, wherein one of said plurality of color filter layers is a green color filter layer and said green color filter layer is made of a cyan dye and a yellow dye piled.

5. A solid-state imaging device according to claim 1, wherein a diameter of said lens above said green color filter layer is larger than those of other lenses.

6. A solid-state imaging device, comprising:

a plurality of light sensitive portions formed on a semiconductor substrate;

a plurality of color filter layers formed above said respective light sensitive portions; and a plurality of single lenses formed one each above said respective color filter layers, wherein diameters of said lenses in light receiving area are made substantially identical to one another, and curvatures of said plurality of single lenses being made different from one another in accordance with thicknesses of said color filter layers.

7. A solid-state imaging device according to claim 6, wherein said color filter layers are made of cyan, yellow and magenta dyes, respectively.

8. A solid-state imaging device according to claim 6, wherein one of said plurality of color filter layers is a green color filter layer and said green color filter layer is made of a cyan dye and a yellow dye piled.

9. A solid-state imaging device according to claim 6, wherein the values of curvature of said lens formed above said green color filter layer is smaller than those of other lenses.

10. A solid-state imaging device, comprising:

a plurality of light sensitive portions formed on a semiconductor substrate;

a plurality of color filter layers formed above said respective light sensitive portions; and a plurality of lenses formed above said respective color filter layers, wherein diameters of said lenses in light receiving area are made different from one another in accordance with refractive indexes of said color filter layers.

11. A solid-state imaging device according to claim 10, wherein said lenses have substantially the same values of curvature.

12. A solid-state imaging device according to claim 10, wherein said color filter layers are made of cyan, yellow and magenta dyes, respectively.

13. A solid-state imaging device according to claim 10, wherein one of said plurality of color filter layers is a green color filter and said green color filter layer is made of a cyan dye and a yellow dye piled.

14. A solid-state imaging device according to claim 10, wherein a diameter of said lens above said green color filter layer is larger than those of other lenses.

15. A solid-state imaging device, comprising:

a plurality of light sensitive portions formed on a semiconductor substrate;

a plurality of color filter layers formed above said respective light sensitive portions; and a plurality of single lenses formed one each above said respective color filter layers, wherein diameters of said lenses in light receiving area are made substantially identical to one another and curvature of said plurality of single lenses are made different from one another in accordance with refractive indexes of said color filter layers.

16. A solid-state imaging device according to claim 15, wherein said color filter layers are made of cyan, yellow and magenta dyes, respectively.

17. A solid-state imaging device according to claim 15, wherein one of said plurality of color filter layers is a green color filter and said green color filter layer is made of a cyan dye and a yellow dye piled.

18. A solid-state imaging device according to claim 15, wherein a values of curvature of said lens formed above said green color filter layer is smaller than those of other lenses.

19. A solid-state imaging device, comprising:

a plurality of light sensitive portions fabricated on a semiconductor substrate;

a plurality of color filter layers fabricated above said respective light sensitive portions; and a plurality of lenses formed above said respective color filter layers, said lens having a relationship of diameter of light receiving area as Sg>Sy>Sc>Sm, wherein Sg is a diameter of said lens formed above a green color filter layer, Sy is a diameter of said lens formed above a yellow color filter layer, Sc is a diameter of said lens formed above a cyanic color filter layer, and Sm is a diameter of said lens formed above a magenta color filter layer.

* * * * *